United States Patent
Cimino et al.

(10) Patent No.: US 11,533,783 B2
(45) Date of Patent: Dec. 20, 2022

(54) MULTI-ZONE HEATER MODEL-BASED CONTROL IN SEMICONDUCTOR MANUFACTURING

(71) Applicant: Applied Materials, Inc., Santa Clara, CA (US)

(72) Inventors: Mauro Cimino, Santa Clara, CA (US); Don Channa Kaluarachchi, Santa Clara, CA (US); Son Phi, Santa Clara, CA (US); Ramyashree Vishnuprasad, Santa Clara, CA (US); Dmitry Lubomirsky, Cupertino, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 133 days.

(21) Appl. No.: 16/515,993

(22) Filed: Jul. 18, 2019

(65) Prior Publication Data
US 2021/0022212 A1  Jan. 21, 2021

(51) Int. Cl.
*H05B 3/68* (2006.01)
*H05B 1/02* (2006.01)
(Continued)

(52) U.S. Cl.
CPC .......... *H05B 1/0233* (2013.01); *G01K 7/183* (2013.01); *H01J 37/32724* (2013.01); *H01L 21/67248* (2013.01); *H01J 2237/334* (2013.01)

(58) Field of Classification Search
CPC ................ G01K 7/183; H01J 2237/334; H01J 37/32724; H01L 21/67063;
(Continued)

(56) References Cited

U.S. PATENT DOCUMENTS 6,951,587 B1 * 10/2005 Narushima ......... C23C 16/4586
                                                    118/728
7,601,240 B2 * 10/2009 Kagoshima ............. H01L 22/20
                                                    156/345.24
(Continued)

FOREIGN PATENT DOCUMENTS

JP     2010027846 A    2/2010

OTHER PUBLICATIONS

International Search Report and Written Opinion for International Application No. PCT/US2020/42640 dated Nov. 4, 2020, 11 pages.
(Continued)

*Primary Examiner* — Sang Y Paik
(74) *Attorney, Agent, or Firm* — Lowenstein Sandler LLP

(57) ABSTRACT

A plurality of heating zones in a substrate support assembly in a chamber is independently controlled. Temperature feedback from a plurality of temperature detectors is provided as a first input to a process control algorithm, which may be a closed-loop algorithm. A second input to the process control algorithm is targeted values of heater temperature for one or more heating zones, as calculated using a model. Targeted values of heater power needed for achieving the targeted values of heater temperature for the one or more heating zones is calculated. Chamber hardware is controlled to match the targeted value of heater temperature that is correlated with the wafer characteristics corresponding to the current optimum values of the one or more process parameters.

18 Claims, 10 Drawing Sheets

(51) Int. Cl.
  *G01K 7/18* (2006.01)
  *H01J 37/32* (2006.01)
  *H01L 21/67* (2006.01)

(58) Field of Classification Search
  CPC ......... H01L 21/67103; H01L 21/67213; H01L 21/67248; H01L 21/6833; H01L 21/687; H01L 21/68714; H01L 21/68742; H01L 21/68785; H05B 1/0233
  USPC ............................................ 219/443.1–468.2
  See application file for complete search history.

(56) References Cited

U.S. PATENT DOCUMENTS

| | | | |
|---|---|---|---|
| 9,681,497 B2 | 6/2017 | Nangoy et al. | |
| 2003/0186545 A1* | 10/2003 | Kamp | H01L 21/31116 438/689 |
| 2004/0168767 A1* | 9/2004 | Kanno | H01J 37/32082 156/345.27 |
| 2005/0267606 A1* | 12/2005 | Bartlett | G05B 13/042 700/29 |
| 2011/0143462 A1* | 6/2011 | Gaff | H01J 37/20 438/9 |
| 2012/0048467 A1 | 3/2012 | Mahadeswaraswamy et al. | |
| 2015/0219499 A1 | 8/2015 | Waldmann et al. | |
| 2016/0035544 A1* | 2/2016 | Lubomirsky | H01J 37/32715 118/723 R |
| 2017/0215230 A1 | 7/2017 | Parkhe | |
| 2018/0218925 A1 | 8/2018 | Shigetomi et al. | |
| 2019/0148120 A1 | 5/2019 | Oka | |

OTHER PUBLICATIONS

Taiwan Search report of Taiwan Application No. TW109124228 dated Feb. 27, 2022.

* cited by examiner

|  | CS-ROW 1 | CS-ROW 2 | CS-ROW 3 | CS-ROW 4 | CS-ROW 5 | CS-ROW 6 | CS-ROW 7 | CS-ROW 8 | CS-ROW 9 |  |
|---|---|---|---|---|---|---|---|---|---|---|
| COL 11 | RTD 81 | RTD 82 | RTD 83 | RTD 84 | RTD 85 | RTD 86 | RTD 87 | RTD 88 |  | READ-COL 11 |
| COL 10 | RTD 73 | RTD 74 | RTD 75 | RTD 76 | RTD 77 | RTD 78 | RTD 79 | RTD 80 |  | READ-COL 10 |
| COL 9 | RTD 65 | RTD 66 | RTD 67 | RTD 68 | RTD 69 | RTD 70 | RTD 71 | RTD 72 |  | READ-COL 9 |
| COL 8 | RTD 57 | RTD 58 | RTD 59 | RTD 60 | RTD 61 | RTD 62 | RTD 63 | RTD 64 |  | READ-COL 8 |
| COL 7 | RTD 49 | RTD 50 | RTD 51 | RTD 52 | RTD 53 | RTD 54 | RTD 55 | RTD 56 |  | READ-COL 7 |
| COL 6 | RTD 41 | RTD 42 | RTD 43 | RTD 44 | RTD 45 | RTD 46 | RTD 47 | RTD 48 |  | READ-COL 6 |
| COL 5 | RTD 33 | RTD 34 | RTD 35 | RTD 36 | RTD 37 | RTD 38 | RTD 39 | RTD 40 |  | READ-COL 5 |
| COL 4 | RTD 25 | RTD 26 | RTD 27 | RTD 28 | RTD 29 | RTD 30 | RTD 31 | RTD 32 |  | READ-COL 4 |
| COL 3 | RTD 17 | RTD 18 | RTD 19 | RTD 20 | RTD 21 | RTD 22 | RTD 23 | RTD 24 |  | READ-COL 3 |
| COL 2 | RTD 9 | RTD 10 | RTD 11 | RTD 12 | RTD 13 | RTD 14 | RTD 15 | RTD 16 | RTD 90 | READ-COL 2 |
| COL 1 | RTD 1 | RTD 2 | RTD 3 | RTD 4 | RTD 5 | RTD 6 | RTD 7 | RTD 8 | RTD 89 | READ-COL 1 |
|  | ROW 1 | ROW 2 | ROW 3 | ROW 4 | ROW 5 | ROW 6 | ROW 7 | ROW 8 | ROW 9 |  |

FIG. 5

MULTI-ZONE HEATER MODEL-BASED CONTROL IN SEMICONDUCTOR MANUFACTURING

TECHNICAL FIELD

Implementations described herein generally relate to semiconductor manufacturing and more particularly to a model-based control architecture for a temperature controlled substrate support assembly and use of the same in process control.

BACKGROUND

As the feature size of device patterns get smaller for integrated circuits, the critical dimension (CD) specifications of these features become a more important criterion for stable and repeatable device performance. Allowable CD variation across a substrate (also referred interchangeably as a "wafer" throughout the specification) processed within a processing chamber is difficult to achieve due to chamber asymmetries such as showerhead and substrate temperature, flow conductance, and RF fields (where applicable).

Uniformity of temperature control across the surface of the substrate can be challenging due to the non-homogeneous construction of the substrate support assembly below the substrate. For example, some regions of the substrate support have gas holes, while other regions have lift pin holes that are laterally offset from the gas holes. Still other regions may have heater electrodes. Since the structure of the substrate support can vary regionally, uniformity of heat transfer between the support assembly and substrate is complicated and very difficult to obtain, resulting in local hot and cold spots across the substrate support surface, which consequently results in non-uniformity of processing results along the surface of the substrate.

The regional uniformity of heat transfer between the substrate support assembly and substrate is further complicated by heat transfer schemes commonly utilized in conventional substrate support assemblies. For example, conventional substrate supports typically have only edge to center temperature control. Local hot and cold spots within the substrate support cannot be compensated for while utilizing the heat transfer features of the conventional substrate supports.

SUMMARY

Implementation described herein provides methods and systems for independently controlling a plurality of heating zones in a substrate support assembly in a chamber processing a wafer placed on the substrate support assembly. Temperature feedback from a plurality of temperature detectors is provided as a first input to a process control algorithm. A second input to the process control algorithm is targeted values of heater temperature for one or more heating zones, as calculated using a model. Targeted values of heater power needed for achieving the targeted values of heater temperature for the one or more heating zones is calculated. Chamber hardware is controlled to match the targeted value of heater temperature that is correlated with the wafer characteristics corresponding to the current optimum values of the one or more process parameters.

In one aspect of the disclosure, a method is disclosed, the method comprising the operations of: collecting temperature feedback from a plurality of temperature detectors, each of the plurality of temperature detectors being placed in a corresponding heating zone of a plurality of heating zones of a substrate support assembly supporting a wafer; providing data representing the temperature feedback as a first input to a process control algorithm; providing, as a second input to the process control algorithm, targeted values of heater temperature for one or more heating zones of the plurality of heating zones, as calculated using a model; calculating targeted values of heater power for achieving the targeted values of heater temperature for one or more of the heating zones, wherein the calculation is performed, by a processor running the process control algorithm, based on the first input and the second input; and, controlling chamber hardware of a processing chamber comprising the substrate support assembly to match the targeted values of heater temperature for one or more of the heating zones.

The process control algorithm may be a closed-loop algorithm where the operations of collecting the temperature feedback, providing data representing the temperature feedback, providing targeted values of the heater temperature, calculating targeted values of the heater power, and controlling chamber hardware is repeated.

In another aspect of the disclosure, a system is disclosed, comprising: a plurality of temperature detectors, each of the plurality of temperature detectors being placed in a corresponding heating zone of a plurality of heating zones of a substrate support assembly configured to support a wafer; a processor that is to execute a process control algorithm. The processor receives temperature feedback data from the plurality of temperature detectors; provides the temperature feedback data as a first input to the process control algorithm; calculates, using a model stored in a server, targeted values of heater temperature for one or more of the heating zones of the plurality of heating zones; provides, as a second input to the process control algorithm, the targeted values of heater temperature for the one or more heating zones, as calculated by the model; calculates targeted values of heater power for achieving the targeted values of heater temperature for the one or more heating zones, based on the first input and the second input; and, calculates amounts by which chamber hardware of a processing chamber comprising the substrate support assembly is to be adjusted to match the targeted values of heater temperature for one or more of the heating zones.

BRIEF DESCRIPTION OF THE DRAWINGS

So that the manner in which the above recited features of the present invention can be understood in detail, a more particular description, briefly summarized above, is described by reference to implementations, some of which are illustrated in the appended drawings. It is to be noted, however, that the appended drawings illustrate only some embodiments of this invention and are not to be considered limiting of its scope.

FIG. 5 is a tabular depiction of a temperature read-back scheme of a multi-zone heater, according to an embodiment of the present disclosure;

Figure 1:
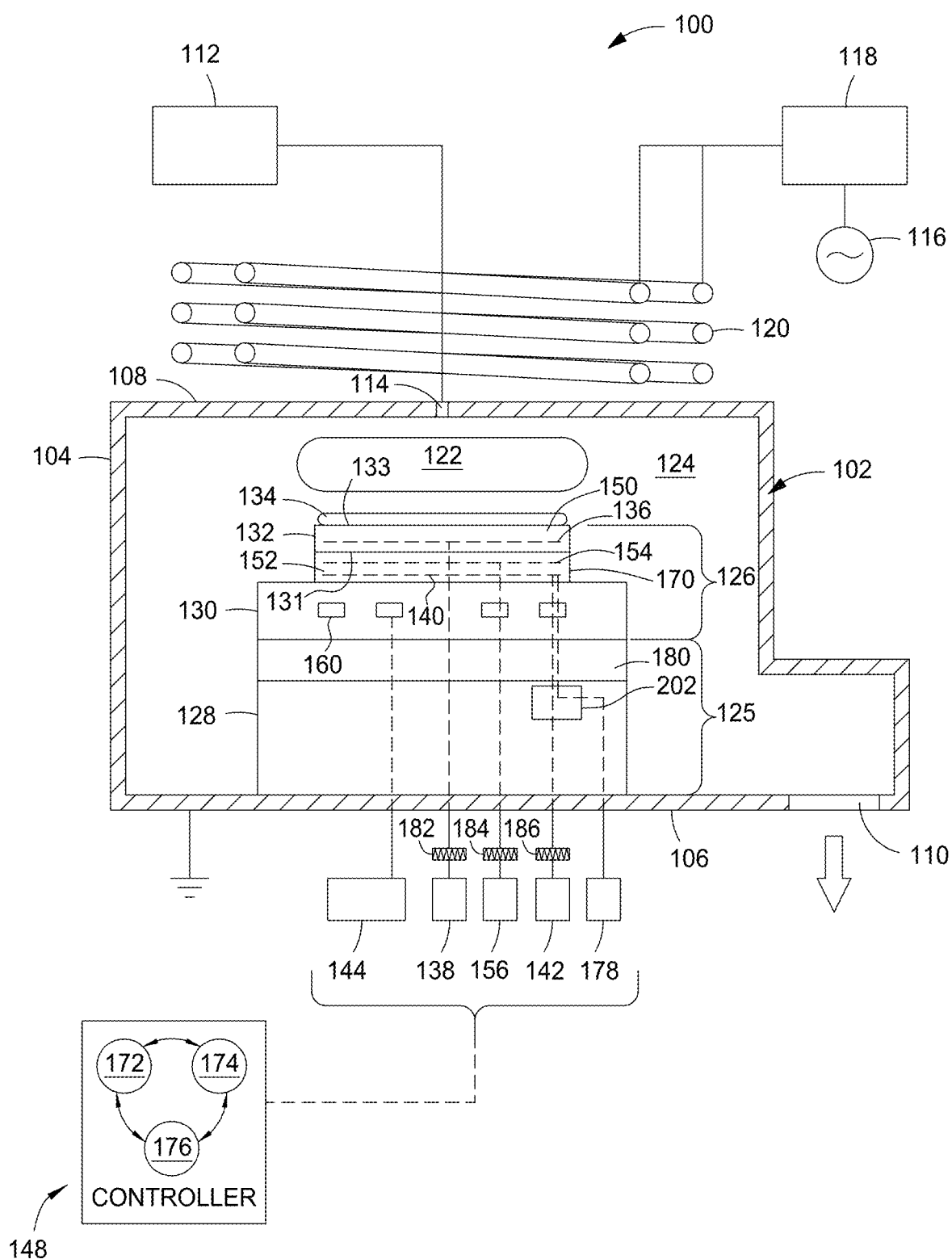
FIG. 1 is a cross-sectional schematic side view of a processing chamber having one embodiment of a substrate support assembly with a multi-zone heater.

It is contemplated that elements disclosed in one implementation may be beneficially used in other implementations without specific recitation.

DETAILED DESCRIPTION

Aspects of the present disclosure are directed to a substrate support assembly which enables local tuning of the temperature of the substrate support assembly itself, which in turn allows local tuning of the temperature profile of a wafer placed on the substrate support assembly within a processing chamber. A closed-loop process control algorithm utilizes temperature feedback from the substrate-support assembly, and uses a model-based method to control heater power to ultimately control process parameters that are correlated with wafer characteristics. Each heating zone may be independently controlled, improving granularity of temperature tuning across the wafer.

Conventional process tuning is not efficient in the case of heaters with large number of heating zones because it does not take into account the zone-to-zone temperature influence, and it often requires multiple tuning iterations before achieving any reasonable performance. The present disclosure uses a model-based temperature controller derived with a machine learning algorithm. Such a controller uses real-time temperature feedback from spatial sensors disposed in proximity to resistive heating elements in the substrate support assembly, and available chamber status information combined with mathematical models of their effect on the temperature sensors, to improve the closed-loop control performance.

In embodiments, a substrate support assembly includes multiple heating zones. Each heating zone may be heated by a heating element located in that heating zone. Each heating zone may also have a temperature detector that provides real-time temperature feedback to a closed-loop process control algorithm described in further detail below. A substrate support assembly may include anywhere from two heating zones to hundreds of heating zones (e.g., 176 heating zones in one embodiment that has two regions ("sides"), each region having 88 independently-controllable heating zones). Each heating zone includes a separate temperature sensor, which may be a resistance thermometer detector (RTD) or, in some embodiments, a thermocouple. The multiple heating elements may share one or more common grounds, and the temperature sensors may share one or more additional common grounds. By having a separate temperature sensor for each heating element, a temperature controller may determine when any of the heating elements fails. Additionally, if the temperature sensors are calibrated, they can determine the temperature at a specific heating zone and may be used for feedback control of the heating element associated with that heating zone.

Although the substrate support assembly is described below in an etch processing chamber, the substrate support assembly may be utilized in other types of processing chambers, such as physical vapor deposition chambers, chemical vapor deposition chambers, ion implantation chambers, among others, and other systems where azimuthal tuning of a lateral temperature profile is desirable. It is also contemplated that the spatially tunable (also referred to as "independently controllable") heaters may also be utilized to control the temperature of other surfaces, including those not used for semiconductor processing.

In one or more embodiments, the substrate support assembly allows for the correction of critical dimension (CD) variation at the edge of the substrate during vacuum processing, such as etching, deposition, implantation and the like based on adjusting the substrate temperature to compensate for chamber non-uniformities such as temperature, flow conductance, electrical fields, plasma density and the like.

FIG. 1 is a longitudinal sectional schematic view of an exemplary etch processing chamber 100 having a substrate support assembly 126. As discussed above, the substrate support assembly 126 may be utilized in other processing chambers, such as plasma treatment chambers, annealing chambers, physical vapor deposition chambers, chemical vapor deposition chambers, ion implantation chambers, and so on. Additionally, the substrate support assembly 126 may be used for other systems where the ability to control a temperature profile of a surface or workpiece, such as a substrate, is beneficial. Independent and local control of the temperature across many discrete regions across a surface beneficially enables azimuthal tuning of the temperature profile, center to edge tuning of the temperature profile, and reduction of local temperature asperities, such as hot and cool spots.

The processing chamber 100 includes a grounded chamber body 102 in one embodiment. The chamber body 102 includes walls 104, a bottom 106 and a lid 108 which enclose an internal volume 124. The substrate support assembly 126 is disposed in the internal volume 124 and supports a substrate 134 during processing.

The walls 104 of the processing chamber 100 may include an opening (not shown) through which the substrate 134 may be robotically transferred into and out of the internal volume 124. A pumping port 110 is formed in one of the walls 104 or the bottom 106 of the chamber body 102 and is fluidly connected to a pumping system (not shown). The pumping system may maintain a vacuum environment within the internal volume 124 of the processing chamber 100, and may remove processing byproducts from the processing chamber.

A gas panel 112 may provide process gases and/or other gases to the internal volume 124 of the processing chamber 100 through one or more inlet ports 114 formed in the lid 108 and/or walls 104 of the chamber body 102. In one embodiment, the lid may comprise a showerhead (not separately shown). The process gases provided by the gas panel 112 may be energized within the internal volume 124 to form a plasma 122 utilized to process the substrate 134 disposed on the substrate support assembly 126. The process gases may be energized by RF power inductively coupled to the process gases from a plasma applicator 120 positioned outside the chamber body 102. In the embodiment depicted in FIG. 1, the plasma applicator 120 is a pair of coaxial coils coupled through a matching circuit 118 to an RF power source 116. Note that the scope of the disclosure is broader than substrate support assemblies for RF applications.

A controller 148 is coupled to the processing chamber 100 to control operation of the processing chamber 100 and processing of the substrate 134. The controller 148 may be a general-purpose data processing system that can be used in an industrial setting for controlling various subprocessors and subcontrollers. Generally, the controller 148 includes a central processing unit (CPU) 172 in communication with memory 174 and input/output (I/O) circuitry 176, among other common components. Software commands executed by the CPU of the controller 148 may cause the processing chamber to, for example, introduce an etchant gas mixture (i.e., processing gas) into the internal volume 124, form the plasma 122 from the processing gas by application of RF power from the plasma applicator 120, and etch a layer of material on the substrate 134.

The substrate support assembly 126 generally includes at least a substrate support 132. The substrate support 132 may be a vacuum chuck, an electrostatic chuck (ESC) or other workpiece support surface. Though in some examples, an ESC is explicitly mentioned as the type of substrate support 132, the scope of this disclosure is not limited to ESCs. The substrate support assembly 126 may additionally include a heater assembly 170 that includes main resistive heating elements 154 (also referred to as main resistive heaters) and a plurality of additional resistive heating elements referred to herein as spatially tunable heating elements 140 (also referred to as independently controllable heaters).

The substrate support assembly 126 may also include a cooling base 130 that is heated/cooled by a chiller/heat-exchanger 144 coupled to the cooling base. The cooling base 130 may alternately be separate from the substrate support assembly 126. The substrate support assembly 126 may be removably coupled to a support pedestal 125. The support pedestal 125, which may include a pedestal base 128 and a facility plate 180, is mounted to the chamber body 102. The substrate support assembly 126 may be periodically removed from the support pedestal 125 to allow for refurbishment of one or more components of the substrate support assembly 126.

The facility plate 180 is configured to accommodate one or more driving mechanisms configured to raise and lower multiple lifting pins. Additionally, the facility plate 180 is configured to accommodate fluid connections from the substrate support 132 and the cooling base 130. The facility plate 180 is also configured to accommodate electrical connections from the substrate support 132 and the heater assembly 170. The myriad of connections may run externally or internally of the substrate support assembly 126, and the facility plate 180 may provide an interface for the connections to a respective terminus.

The substrate support 132 has a mounting surface 131 and a workpiece surface 133 opposite the mounting surface 131. An ESC-based substrate support 132 shown in the example of FIG. 1 generally includes a chucking electrode 136 embedded in a dielectric body 150. The chucking electrode 136 may be configured as a mono polar or bipolar electrode, or other suitable arrangement. The chucking electrode 136 may be coupled through a radio frequency (RF) filter 182 to a chucking power source 138 which provides an RF or direct current (DC) power to electrostatically secure the substrate 134 to the upper surface of the dielectric body 150. For non-ESC-based substrate support 132, other types of mechanisms (such as mechanical clamping, vacuum-based clamping etc.) may be used to secure the substrate 134 to the substrate support 132. The RF filter 182 prevents RF power utilized to form a plasma 122 within the processing chamber 100 from damaging electrical equipment or presenting an electrical hazard outside the chamber. Once again, this disclosure is not limited by an ESC-based substrate support and/or to substrate support for RF applications.

A workpiece surface 133 of the substrate support 132 may include gas passages (not shown) for providing backside heat transfer gas to an interstitial space defined between the substrate 134 and the workpiece surface 133 of the substrate support 132. The substrate support 132 may also include lift pin holes for accommodating lift pins (both not shown) for elevating the substrate 134 above the workpiece surface 133 of the substrate support 132 to facilitate robotic transfer into and out of the processing chamber 100.

The temperature controlled cooling base 130 is coupled to a chiller/heat-exchanger (HX) 144, which is a heat transfer fluid source. The chiller/heat-exchanger 144 provides a heat transfer fluid, such as a liquid, gas or combination thereof, which is circulated through one or more conduits 160 disposed in the cooling base 130. The fluid flowing through neighboring conduits 160 may be isolated to enable local control of the heat transfer between the substrate support 132 and different regions of the cooling base 130, which assists in controlling the lateral temperature profile of the substrate 134.

A fluid distributor (not shown) may be fluidly coupled between an outlet of the chiller/heat-exchanger 144 and the temperature controlled cooling base 130. The fluid distributor operates to control an amount of heat transfer fluid provided to the conduits 160. The fluid distributor may be disposed outside of the processing chamber 100, within the substrate support assembly 126, within the pedestal base 128, or at another suitable location.

The heater assembly 170 may include one or more main resistive heaters 154 and/or a plurality of spatially tunable heaters 140 embedded in a body 152. In some embodiments, the main resistive heaters and the spatially tunable heaters may be the same elements. The body 152 may additionally include a plurality of temperature sensors (not shown in FIG. 1). Each of the plurality of temperature sensors may be used to measure a temperature at a region of the heater assembly and/or of a region of a substrate support associated with a region of the heater assembly. In one embodiment, the heater assembly 170 is included in the substrate support 132.

The main resistive heaters 154 may be provided to elevate the temperature of the substrate support assembly 126 to a temperature for conducting chamber processes. The spatially tunable heaters 140 are complimentary to the main resistive heaters 154 and are configured to adjust the localized temperature of the substrate support 132 in a plurality of discrete locations within one or more of a plurality of laterally separated heating zones defined by the main resistive heaters 154. The spatially tunable heaters 140 provide localized adjustments to the temperature profile of the substrate 134 placed on the substrate support assembly 126. The main resistive heaters 154 operate on a globalized macro scale while the spatially tunable heaters 140 operate on a localized micro scale.

The main resistive heaters 154 may be coupled through an RF filter 184 to a main heater power source 156. The main heater power source 156 may provide 900 watts or more power to the main resistive heaters 154. The controller 148 may control the operation of the main heater power source 156, which is generally set to heat the substrate 134 to about a predefined temperature. In one embodiment, the main resistive heaters 154 include laterally separated heating zones, wherein the controller 148 enables one zone of the main resistive heaters 154 to be preferentially heated relative to the main resistive heaters 154 located in one or more of the other zones. For example, the main resistive heaters 154 may be arranged concentrically in a plurality of separated heating zones.

In one embodiment, the main resistive heaters 154 and/or the spatially tunable heaters 140 may be formed in the substrate support 132. In such an embodiment, the substrate support assembly 126 may be formed without the heater assembly 170, with the substrate support 132 disposed directly on the cooling base 130. A tuning heater controller 202 (which may be part of the controller 148) may be disposed adjacent to the cooling base and selectively control individual spatially tunable heaters 140.

The substrate support 132 and/or heater assembly 170 may include a plurality of temperature sensors for providing temperature feedback information. The temperature feedback information may be sent to the controller 148 for controlling the power applied by the main heater power source 156 to the main resistive heaters 154, for controlling the operations of the cooling base 130, and/or for controlling the power applied by the tuning heater power source 142 to the spatially tunable heaters 140. Alternatively, or additionally, the temperature feedback information may be provided to the heater controller 202 for determining the operability of the spatially tunable heaters 140 and/or for controlling the power applied to the spatially tunable heaters 140. Each temperature sensor may be located proximate to one of the spatially tunable heaters and may be used to determine an operability of the nearby spatially tunable heater. In one embodiment, each temperature sensor is a resistance temperature detector (RTD).

The temperature of the surface for the substrate 134 in the processing chamber 100 may be influenced by the evacuation of the process gasses by the pump, by the slit valve door, and/or by other factors. The cooling base 130, the one or more main resistive heaters 154, and the spatially tunable heaters 140 all help to control the surface temperature of the substrate 134.

As the number of independently controllable heating zones increase, the ability of generating a tailored thermal profile across a substrate also enhances. The advantage of minimizing variations in the critical dimensions across a substrate drives the reduction of acceptable variation in a determined process temperature of the substrate surface. The spatially tunable heaters 140 improve the temperature profile of the surface of the substrate 134 produced by the main resistive heaters 154 by reducing variations in the temperature profile. The temperature profile may be made uniform or to vary precisely in a predetermined manner across regions of the substrate 134 through the use of the spatially tunable heaters 140.

It is contemplated that the spatially tunable heaters 140, the main resistive heaters 154, and the temperature sensors may be arranged in different configurations and orientations. For example, the substrate support assembly 126 may have the plurality of spatially tunable heaters 140 for heating the substrate 134, may lack the main resistive heaters 154, and may include the temperature sensors to monitor the spatially tunable heaters 140. Alternatively, the substrate support assembly 126 may have the main resistive heaters 154 and the temperature sensors, but may lack the spatially tunable heaters 140. In such an embodiment, the temperature sensors would be disposed in a plane that is proximate to a plane that includes the main resistive heaters 154. In one embodiment, the spatially tunable heaters 140 and the main resistive heaters 154 are disposed directly under each other within substrate support assembly 126. The spatially tunable heaters 140 may provide fine tune control for the temperature profile of the substrate 134 supported by the substrate support assembly 126, and the temperature sensors may provide detailed information on the operation of the spatially tunable heaters 140.

Similar to the spatially tunable heaters 140, the temperature sensors may be formed or disposed on or in the body 152 of the heater assembly 170. Alternatively, the temperature sensors may be formed or disposed on or in electrostatic chuck 132. The temperature sensors in one embodiment are RTDs. A coefficient of resistance of the RTDs may be a function of temperature. Accordingly, the resistance of the RTDs may change based on changes in the temperature. The resistance at each RTD may be measured to determine whether a particular spatially tunable heater 140 is working and/or a temperature of the spatially tunable heater 140. Alternatively, the temperature sensors may be thermocouples.

In one embodiment, the spatially tunable heaters 140 and temperature sensors are disposed within the heater assembly 170 while forming the heater assembly 170. In another embodiment, the spatially tunable heaters 140 and/or temperature sensors are directly disposed on the mounting surface 131 of the substrate support 132. In some embodiments, the main resistive heaters 154 are fabricated similar to the spatially tunable heaters 140. In embodiments where the main resistive heaters 154 are fabricated similar to the spatially tunable heaters 140, the main resistive heaters may optionally be utilized without benefit of additional spatially tunable heaters 140. In other words, the main resistive heaters 154 of the substrate support assembly 126 may themselves be spatially tunable, that is, segmented in to a plurality of discreet resistive heating elements. A separate temperature sensor may be disposed proximate to each of the main resistive heaters 154 in such an embodiment. Segmenting the main resistive heaters 154 in the form of small resistive heaters allows local control of hot and cold spots on the surface of the substrate 134. An additional layer of spatially tunable heaters 140 is optional, depending on the level of temperature control to be implemented.

Figure 2:
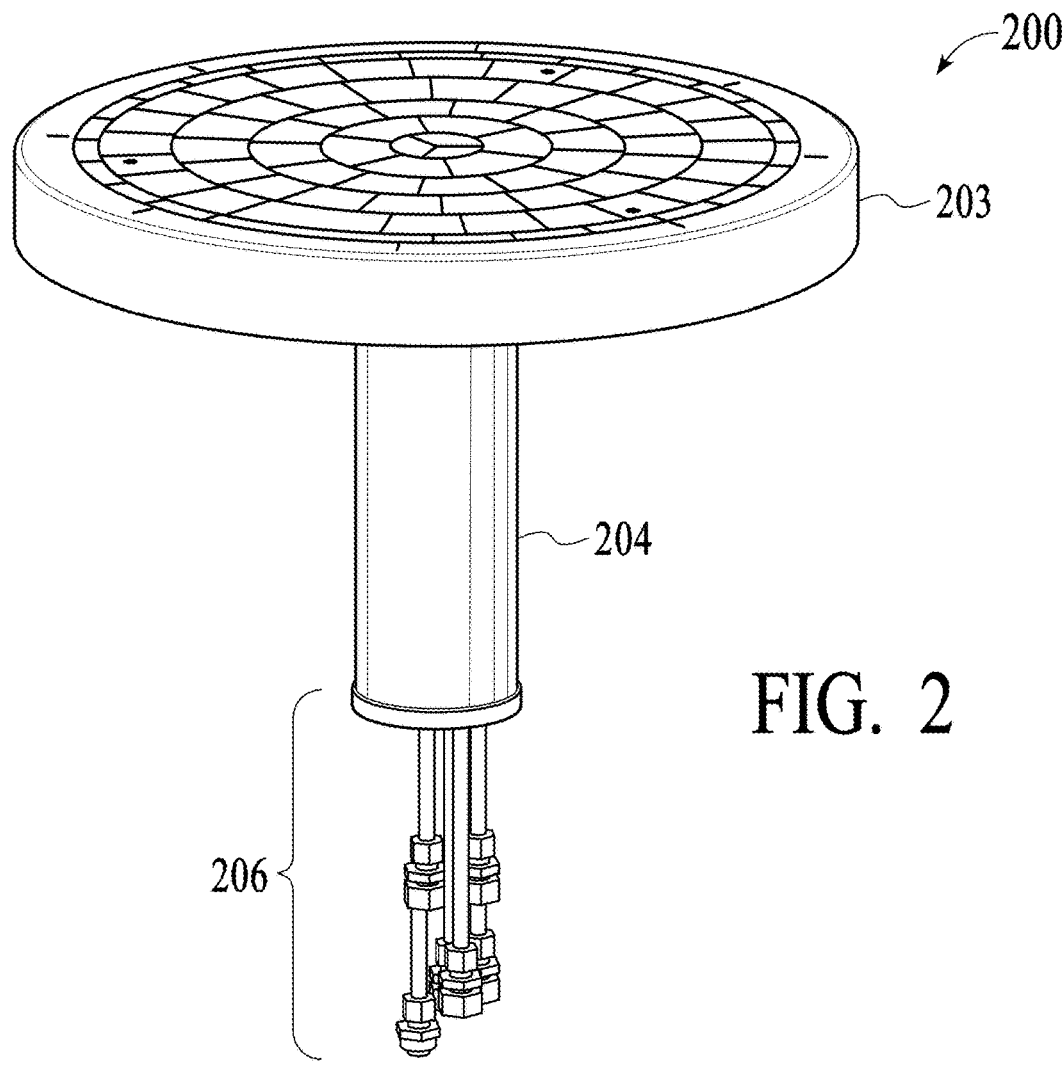
FIG. 2 is a perspective view of another embodiment of a heater assembly with a multi-zone heater.

FIG. 2 shows an alternate configuration of a substrate support assembly 126. This substrate support assembly 200 has a heater assembly 203 at the top and a shaft 204 at the bottom. Electrical connections 206 couple the heating elements in the heater assembly 203 to an external temperature controller (such as a control interface printed circuit board (PCB), as described in greater detail in FIG. 10).

Figure 3:
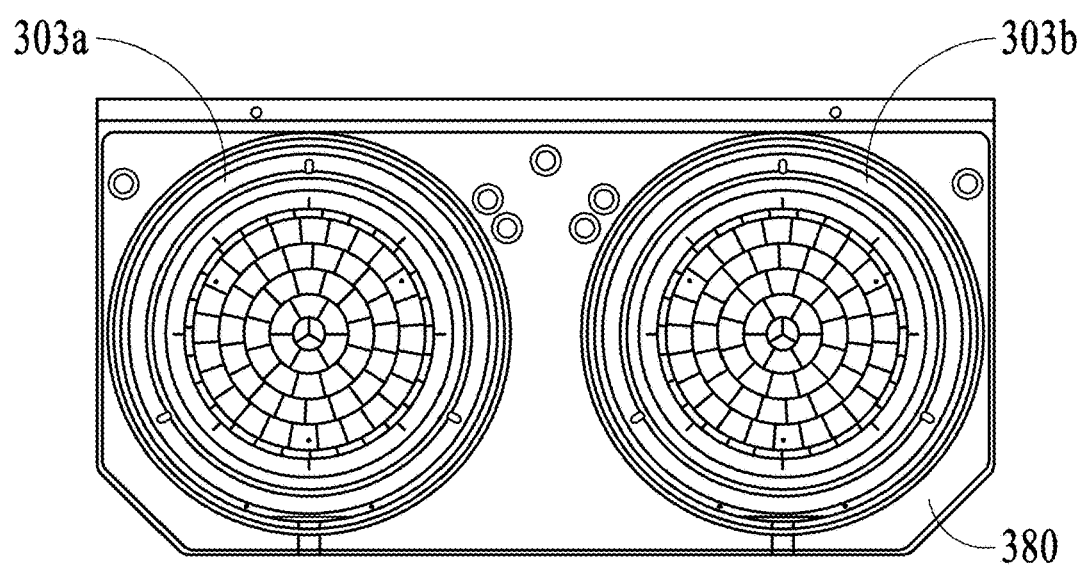
FIG. 3 shows a top view of a facility plate containing two multi-zone heaters disposed side by side, according to an embodiment of the present disclosure.

FIG. 3 shows a top view of a facility plate containing two multi-zone heaters disposed side by side, according to an embodiment of the present disclosure. Though in this example, there are two main heating regions within a facility plate 380, each heating region having its own multi-zone heater 303a and 303b, there may be any arbitrary number of heating regions within the facility plate 380. Each heating region may be controlled independent of each other.

Figure 4:
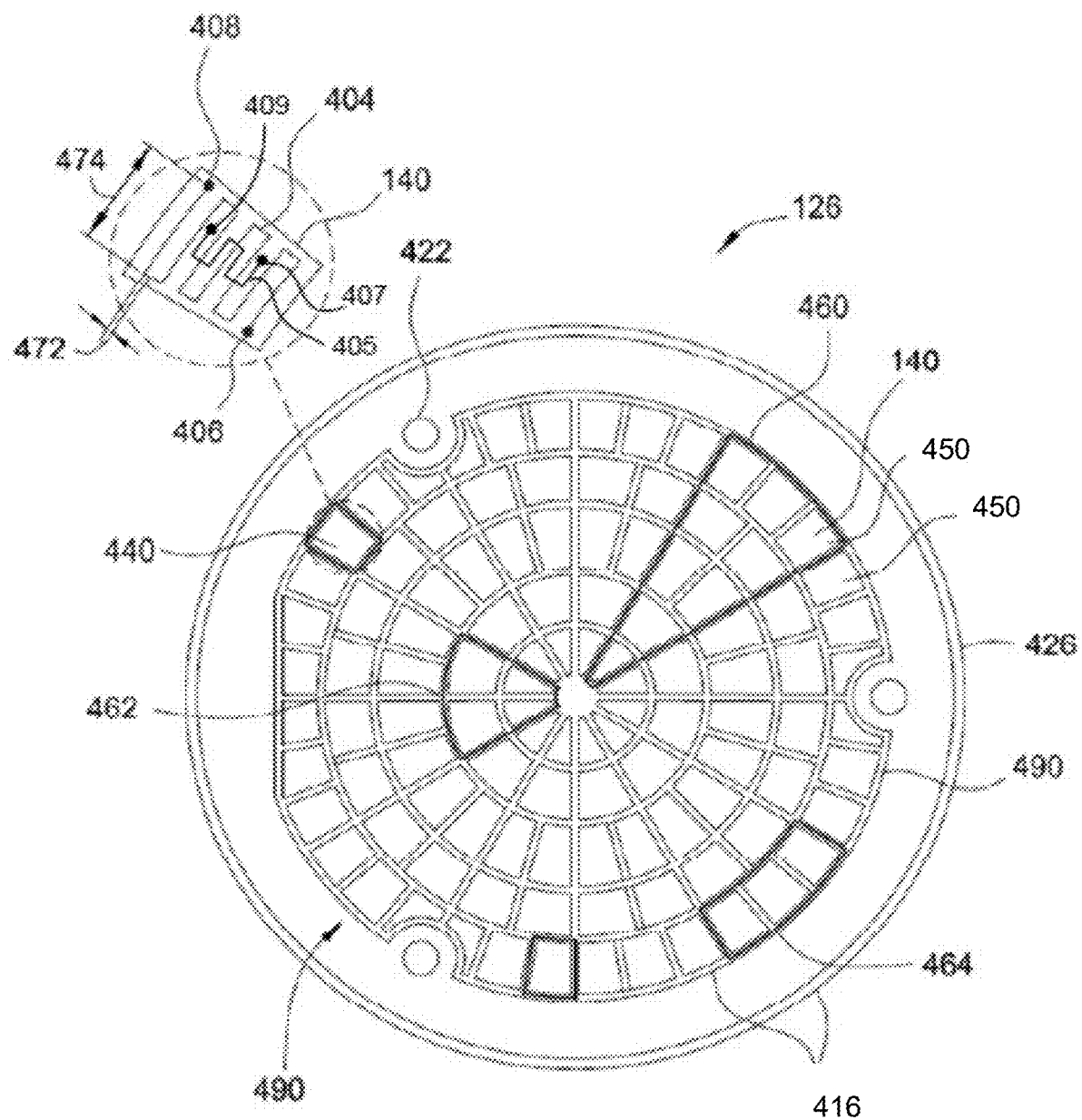
FIG. 4 is a top view of a multi-zone heater, according to an embodiment of the present disclosure.

FIG. 4 is a sectional view through the body 152 of the heater assembly 170, showing the spatially tunable heaters 140 from the top. The heater assembly 170 may include a plurality of spatially tunable heaters 140 that effectuates heat transfer between the heater assembly 170 and substrate support 132. Each spatially tunable heater 140 may be laterally arranged across the heater assembly 170, and defines a zone 450 within the heater assembly 170 for locally providing additional heat to a region of the heater assembly 170 (and a portion of the main resistive heater 154) aligned with that zone 450. It is contemplated that there may be hundreds of spatially tunable heaters 140 in a given embodiment of a substrate support assembly 126 configured for use with a full substrate, e.g., a 300 mm substrate.

The heater assembly 170 may further include a plurality of temperature sensors. Each temperature sensor may be laterally arranged across the heater assembly 170 such that each temperature sensor is within a zone 450 in the heater assembly 170 defined by a spatially tunable heater 140. Each temperature sensor may measure the temperature of the zone 450 that it is disposed in and/or determine an operability of the spatially tunable heater 140 in that zone 450. Additionally, one or more temperature sensors that are in a zone defined by a main resistive heater 154 may be used to measure a temperature of the zone and/or to determine an operability of the main resistive heater 154. By individually and independently controlling the power provided to each spatially tunable heater 140, and consequently the heat transfer through zone 450, a pixel by pixel approach to temperature control can be realized which enables specific points of the substrate 134 to be heated or cooled, enabling a truly addressable lateral temperature profile tuning and control of the surface of the substrate 134.

The tuning heater controller 148 may regulate the temperature of the spatially tunable heaters 140 in the heater assembly 170 at each zone 450 relative to the other zones 450. Alternatively, the tuning heater controller 148 regulate the temperature of a group of spatially tunable heaters 140 in the heater assembly 170 across a group of zones 450 relative to the another group of zones 450. The tuning heater controller 202 may toggle the on/off state and/or control a duty cycle for individual spatially tunable heaters 140. Alternately, the tuning heater controller 148 may control the amount of power delivered to the individual spatially tunable heaters 140.

In one embodiment, the heater controller 148 receives temperature measurements from the plurality of temperature sensors. The heater controller 148 may receive each temperature measurement as a resistance measurement in one embodiment. The heater controller 148 may then convert the resistance measurement to a temperature measurement based on a resistance to temperature conversion model. A separate resistance to temperature conversion model may be used for each temperature sensor. Alternatively, the same resistance to temperature conversion model may be used for multiple temperature sensors. The resistance to temperature conversion models may be generated by performing a calibration of the temperature sensors.

The heater controller 148 may compare a received temperature measurement for each temperature sensor to an expected temperature measurement for that temperature sensor. The expected temperature measurement for a temperature sensor may be based on a current setting of a spatially tunable heater 140 and/or a current setting of a main resistive heater 154 that are associated with a zone in which the temperature sensor is located. If a delta between the expected temperature measurement and the received temperature measurement for a temperature sensor exceeds a threshold, then heater controller 148 may adjust a duty cycle and/or power of a particular spatially tunable heater 140 associated with the temperature sensor. Alternatively, or additionally, the heater controller 148 may adjust a duty cycle and/or power of a main resistive heater associated with the temperature sensor.

In one embodiment, each zone 450 may be thermally isolated from the neighboring zones 450, for example, using a thermal choke 416, which enables more precise temperature control. In another embodiment, each zone 450 may be thermally joined to an adjacent zone creating an analogue (i.e., smooth or blended) temperature profile along an upper surface of the heater assembly 170.

The use of independently controllable spatially tunable heaters 140 enables control of the local temperature uniformity across the substrate to very small tolerances, and enables precise process and CD control when processing the substrate 134. Additionally, the small size and high density of the spatially tunable heaters 140 enables temperature control at specific locations on the substrate support assembly 126, without substantially affecting the temperature of neighboring areas. This allows local hot and cool spots to be compensated for without introducing skewing or other temperature asymmetries. The substrate support assembly 126, having a plurality of spatially tunable heaters 140, has an ability to control the temperature uniformity of a substrate 134 processed thereon.

Each spatially tunable heater 140 has a resistor 404 ending in terminals 406, 408. As current enters one terminal, such as the terminal labeled 406, and exists the other terminal, such as the terminal labeled 408, the current travels across the wire of the resistor 404 and generates heat. The spatially tunable heater 140 may have a design power density to provide the appropriate temperature rise along the outer surface 426 of the substrate support assembly 126. The amount of heat released by the resistor 404 is proportional to the square of the current passing through that resistor.

The spatially tunable heaters 140 may be configured in a pattern 490 to efficiently generate a heat profile along the surface of the substrate support assembly 126. The pattern 490 may be symmetric about a midpoint while providing clearance in and around holes 422 for lift pins or other mechanical, fluid or electrical connections. Each spatially tunable heater 140 may be controlled by the tuning heater controller 148. The tuning heater controller 148 may turn on a single spatially tunable heater 140 defining a heater 440; or a plurality of spatially tunable heaters 140 grouped to define an inner wedge 462, a perimeter group 464, a pie shaped area 460, or other geometric configuration, including non-contiguous configurations. In this manner, temperature can be precisely controlled at independent locations along the surface of the substrate support assembly 126, such independent locations not limited to a concentric ring such as known in the art. Although the pattern shown is comprised of smaller units, the pattern may alternatively have larger and/or smaller units, extend to the edge, or have other forms.

Also shown in FIG. 4 is an RTD 405, which is one type of temperature sensor. The RTD 405 is positioned above or below the spatially tunable heater 140. As shown, the RTD 405 in most cases will be smaller than the spatially tunable heater 140. The RTD 405 may be a particular type of resistor that changes resistance based on temperature. In one embodiment, the RTD 405 is a platinum wire. Alternatively, the RTD 405 may be any of the other materials discussed herein. The RTD 405 ends in terminals 407 and 409. A current may be sent through the RTD 405 via the terminals, and a resistance of the RTD 405 may be measured to determine a temperature of the spatially tunable heater 140. The material, length of wire, and the wire thickness for the RTD 405 may be selected for to control a temperature range over which the RTD 405 is sensitive.

The spatially tunable heaters 140 may be arranged in the form of a grid, defining an array of temperature control zones 450 also arranged in an x-y grid pattern, a polygonal pattern (e.g., a hexagonal close pack), a polar array pattern, in concentric channel pattern, It should be appreciated, as discussed above, that the spatially tunable heaters 140 may be activated in groups or singularly.

The number and density of the spatially tunable heaters 140 contribute to the ability for controlling the temperature uniformity across the substrate to very small tolerances which enables precise process and CD control when processing the substrate 134. Additionally, individual control of one spatially tunable heater 140 relative to another spatially tunable heater 140 enables temperature control at specific locations in the substrate support assembly 126 without substantially affecting the temperature of neighboring areas, which enables local hot and cool spots to be compensated for without introducing skewing or other temperature asymmetries. In one embodiment, the plurality of spatially tunable heaters 140 in the substrate support assembly 126 in conjunction with the main resistive heaters 154 have an ability to control the temperature uniformity of a substrate 134 processed thereon to less than about ±0.3 degrees Celsius. The spatially tunable heaters 140 allow both lateral and azimuthal tuning of the lateral temperature profile of the substrate 134 processed on the substrate support assembly 126.

The wiring scheme provides for individual control, as opposed to multiplex control, over the spatially tunable heaters 140. The individual control enables any one spatially tunable heater 140, or selection of spatially tunable heaters 140, to be made active at the same time as any other spatially tunable heater 140, or selection of spatially tunable heaters 140. The wiring scheme allows the independent control of an output to one of the plurality of spatially tunable heaters relative to another of the plurality of spatially tunable heaters and allows a quick response time at the spatially tunable heaters 140 for achieving a tailored temperature profile.

The controller 148 may control at least one or more of the duty cycle, voltage, current, or duration of power applied to one or more selected spatially tunable heaters 140 relative another and at the same time.

FIG. 5 shows how the real-time analog temperature readings of the RTDs are communicated through the electrical connections to a digital decoder device that provides RTD row/column temperature read-back in the form of digital data. The particular example shown in FIG. 5 shows temperature read-back from 90 RTDs, spread over 9 rows and 11 columns.

The temperature read-back data collected from the RTDs is used to build mathematical models that are used to design the model-based independent control of the heating zones in a multi-zone heater.

Figure 6:
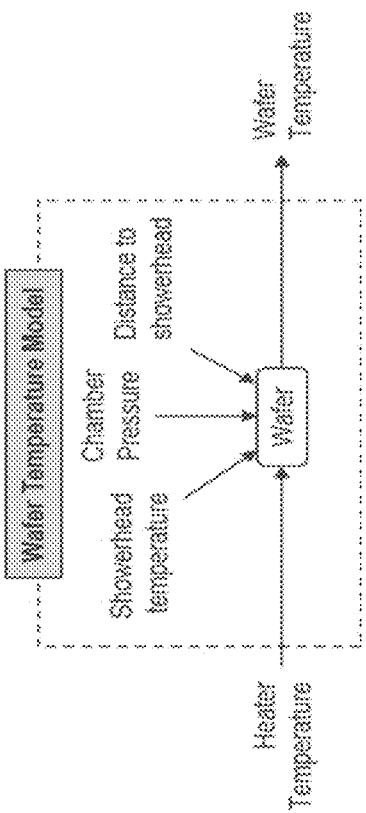
FIG. 6 illustrates generating a mathematical model for calculating wafer etch amount, according to an embodiment of the present disclosure.
Figure 7:
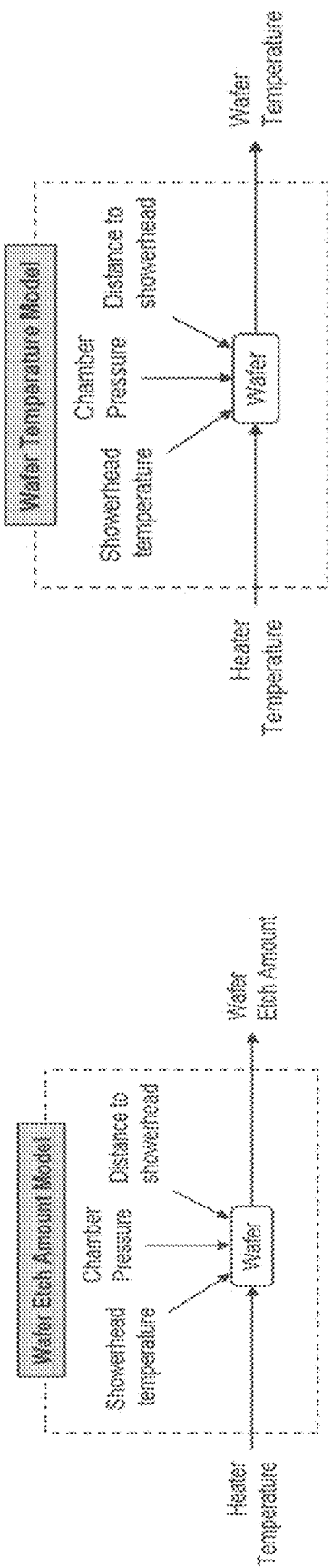
FIG. 7 illustrates generating a mathematical model for calculating wafer temperature, according to an embodiment of the present disclosure.

FIGS. 6-7 show two models that respectively predict wafer etch amount and wafer temperature when heater temperature data is fed to the models as an input. Note that real-time RTD data may be used to train the models to improve accuracy of predicted results, but historical trustworthy data representing heater temperature may be used to build the model. Other inputs to the models comprise various process parameters. In the examples shown in FIGS. 6 and 7, the process parameters used are showerhead temperature, chamber pressure, and distance to showerhead (also referred to as the distance between the showerhead and the heater in the substrate support assembly). Note that other process parameters may be used too, for example, chamber body temperature, heat-exchanger temperature, lift-pin height, process gas etc.

Specifically, in the example shown in FIG. 6, wafer etch amount is predicted by the model based on changes of heater temperature, showerhead temperature, chamber pressure, and distance between the showerhead and the substrate support assembly. In the example shown in FIG. 7, wafer temperature is predicted by the model based on changes of heater temperature, showerhead temperature, chamber pressure, and distance between the showerhead and the substrate support assembly. Note that separate models may be used to predict each wafer characteristic, or a single model may predict multiple wafer characteristics, such as wafer etch amount and wafer temperature.

Figure 8:
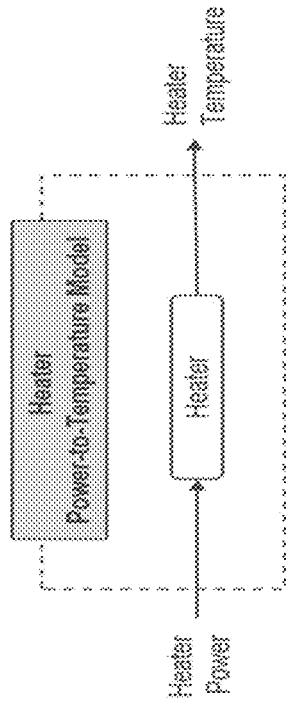
FIG. 8 illustrates generating a mathematical model for calculating heater temperature from heater power and heat-exchanger temperature, according to an embodiment of the present disclosure.
Figure 9:
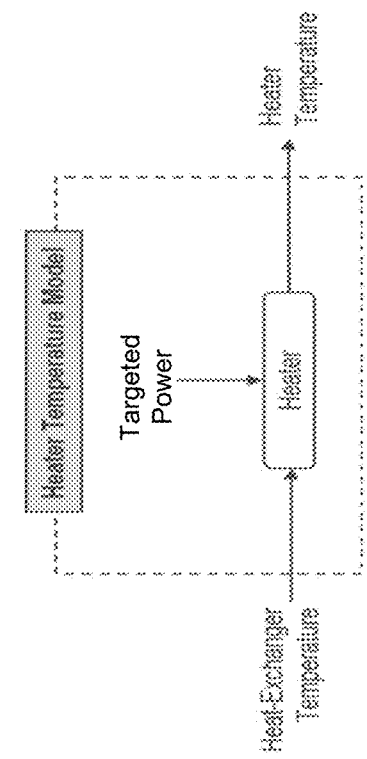
FIG. 9 illustrates generating a mathematical model for calculating heater temperature from heater power, according to an embodiment of the present disclosure.

Note that there may be another model (or set of models) capable of predicting the heater temperature based on different process parameters, for example, heat-exchanger temperature, or heater power. Specifically, in the example shown in FIG. 8, heater temperature is predicted by the model based on changes of heat-exchanger temperature. As the heater temperature is a function of both power delivered to the heater as well as flow of coolant supplied by the heat-exchanger, the model in FIG. 8 can predict the heater temperature more accurately when targeted power to be delivered to the heater is used as an input in addition to heat-exchanger temperature. FIG. 9 shows a model of heater-temperature based on only heater power changes. Each of the models in FIG. 6 to FIG. 9 can be generated using a combination of methods, including a first principle analysis to derive the differential equations defining the structure of the model, and a machine learning algorithm training such models based available data collected from the chamber for different chamber configurations (that is, for different showerhead temperature, chamber pressure, distance to showerhead, heat-exchanger power and heater power). The machine learning algorithm can be derived to perform an offline recursive training of each mathematical model, to allow such models to represent the substrate thermal and etch dynamic behaviors, and to represent the thermal behavior of each of the heating zones within the substrate support.

Figure 10:
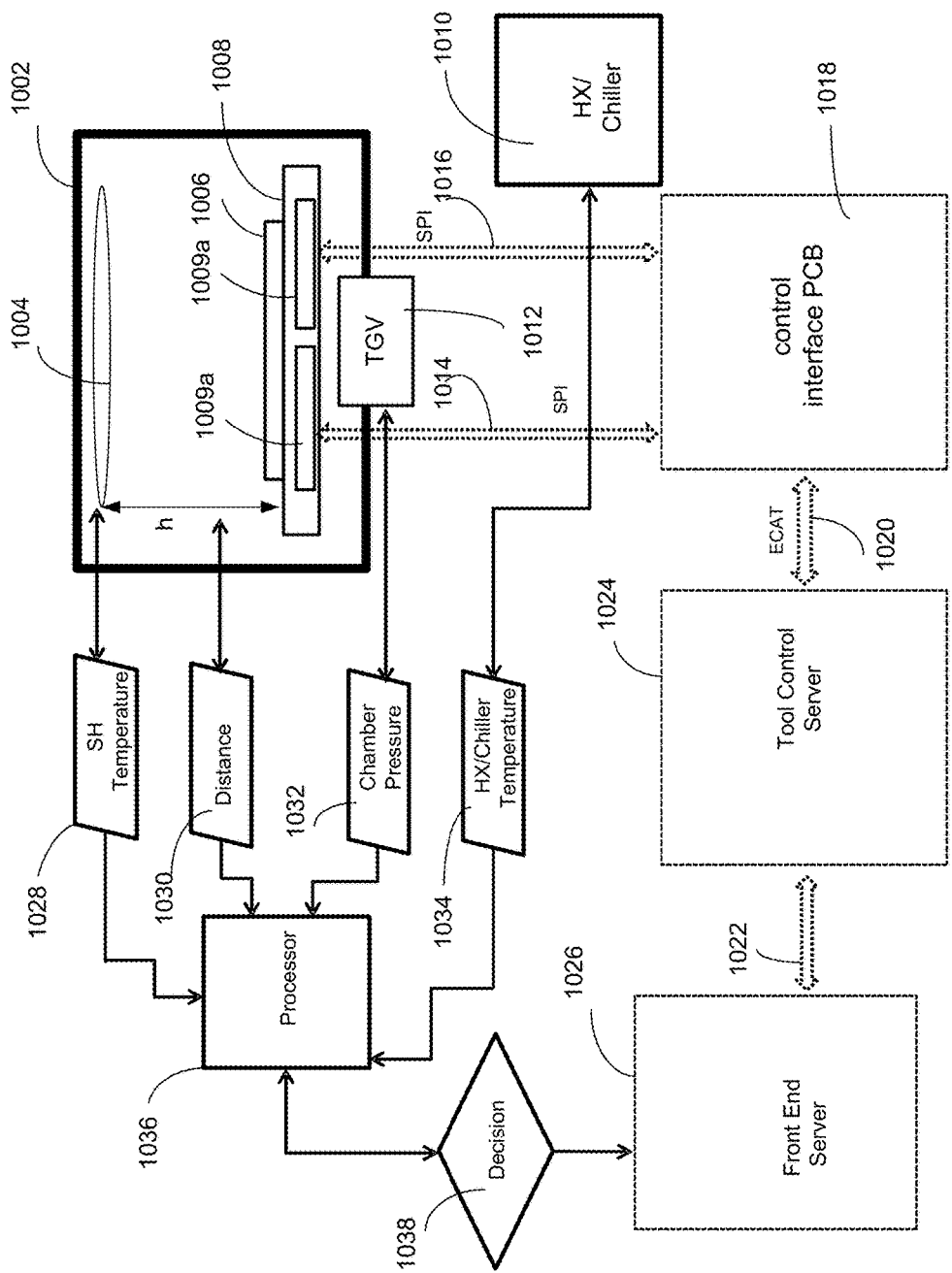
FIG. 10 illustrates a control architecture and function of a system for independently controlling one or more of the multi-zone heaters, according to an embodiment of the present disclosure.

FIG. 10 shows a block diagram representing the control architecture and functionalities of system components in the model-based closed-loop control of heater temperature, which in turn enables model-based control of process parameters. The exemplary process parameters collected from the chamber 1002 are temperature 1028 of the showerhead 1004, the distance 1030 (shown as 'h') between the showerhead and the substrate support assembly 1008, and chamber pressure 1032, as supplied by the throttle gate valve (TGV) 1012. The wafer 1006 is heated by multi-zone heaters 1009a and 1009b that are integrated to the substrate support assembly 1009. RTD temperature data is communicated to the control interface module 1018 via serial peripheral interface (SPI) communication links 1014 and 1016, or other type of communication links. The control interface module functionalities may be carried out by a printed circuit board (PCB) within the module 1018. The module 1018 is communicatively coupled with a front end server (FES) 1026 either directly or through a tool control server (TCS) 1024. In an embodiment, Front End Server 1026 and tool control server 1024 and module 1018 may be coupled via Ethernet for control automation technology (ECAT) communication links 1020 and 1022 or other type of communication links.

A processor 1036 executes a closed-loop control algorithm based on models (e.g., models shown in FIGS. 6-9) and real-time input collected from the chamber 1002. Additional input may be collected from other hardware outside of the chamber, such as the heat-exchanger (HX)/chiller 1010. The HX/chiller 1010 may provide temperature 1034 to the processor. In one embodiment, input data for the trained machine learning model or models may include a vector comprising one or more of the temperature 1028 of the showerhead, the distance 1030, chamber pressure 1032, the heat exchanger temperature 1034 and/or the temperature of one or more temperature sensors associated with heating zones. The model or models may process the input data to generate an output. The output may be a service that automates the calculation of the temperature of the showerhead, the distance between the showerhead and the substrate support assembly, the chamber pressure, and the temperature of the heat-exchanger. The processor 1036 makes a decision 1038 about which of the chamber hardware needs to be controlled, which is communicated to the FES 1026. In some embodiments, the processor 1036 is part of the FES 1026.

A server (which could be a tool control server 1024) receives the calculated targeted values of heater power from the front end server 1026, and calculates amounts by which chamber hardware is to be controlled or adjusted to match the targeted value of heater temperature for the one or more heating zones. Controlling chamber hardware may comprise controlling heater electronics to deliver targeted amount of heater power to one or more heating zones independent of other heating zones. Controlling chamber hardware may also comprise controlling the HX/chiller temperature, as the heater temperature is a function of both heater power and coolant flow. For example, if a zone becomes too hot, colder fluid needs to be supplied to bring down the temperature to the targeted value and less power needs to be delivered to the heater in that zone. On the other hand, if a zone becomes too cold, hotter fluid needs to be supplied to bring down the temperature to the targeted value and more power needs to be delivered to the heater in that zone.

Figure 11:
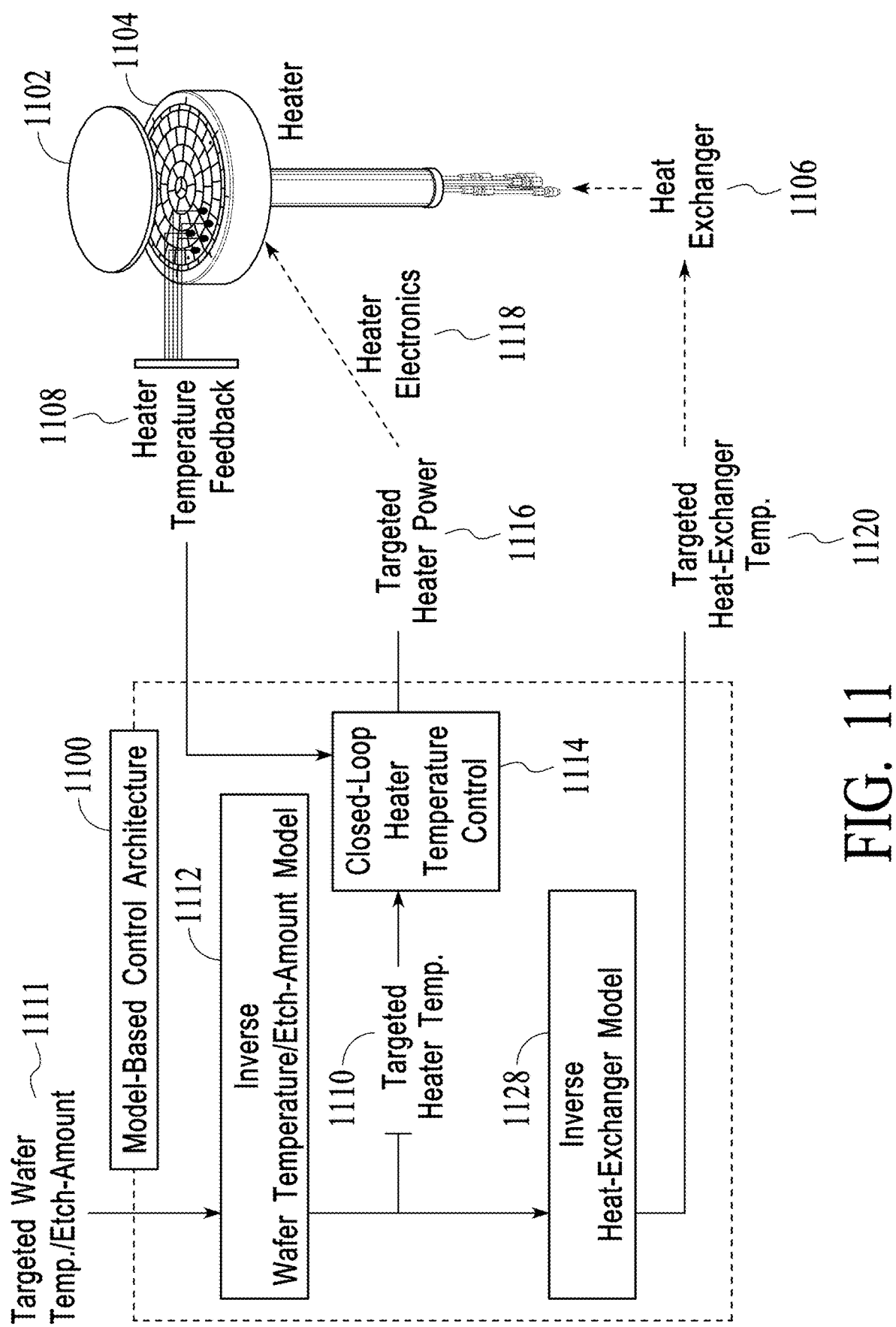
FIG. 11 illustrates a model-based control architecture of a system for independently controlling each of the multi-zone heaters, according to an embodiment of the present disclosure.

FIG. 11 illustrates further details of a model-based control architecture 1100 implemented by the system shown in FIG. 10 for independently controlling each of the zones of the multi-zone heaters. As shown in FIG. 11, a wafer 1102 is placed on a substrate support assembly 1104 with one or more multi-zone heaters. The heater electronics 1118 provides power to the heaters and the heat exchanger 1106 supplies a fluid to control the substrate temperature. Real-time temperature data 1108 from the RTDs is provided to the closed-loop heater temperature control algorithm 1114. The algorithm receives targeted heater temperature value 1110 as calculated by model 1112 based on targeted wafer temperature and/or etch amount 1111. The model 1112 may be an inverse of the models shown in FIGS. 6 and 7, where wafer etch amount and/or wafer temperature are calculated based on heater temperature. The closed-loop heater temperature control algorithm 1114 outputs targeted heater power 1116 based on the targeted heater temperature 110 and the heater temperature feedback 1108, which is communicated to heater electronics 1118 to achieve independent control of a heating zone. The generation of the model can be done using machine learning algorithm, as described earlier in the disclosure. The inverse model representation in FIG. 11 is a functional representation of how the model is used. Since each zone's temperature may behave differently from others, due to different size of the zones' surface area, and due to the different set of neighboring zones surrounding each zone, the same model obtained for one zone cannot be applied for all the zones. Moreover, due to the interaction among adjacent zones, there cannot be independent models for each of the zones. The temperature control model considered in this embodiment comprises a single large-scale model which simultaneously monitors all the zones' temperatures feedback from the available RTD sensors, and based on the behavior of each zone's temperature and the corresponding adjacent ones, simultaneously generates power for all the zones of the substrate support. The targeted heater temperature 1110 comprises a separate target temperature for each of the zones of the substrate support. This allows the closed-loop heater temperature controller 1114 to achieve the desired temperature pattern on the substrate 1102. Similarly, the inverse wafer temperature and inverse wafer etch-amount models can provide an individual targeted heater temperature 1110 for each zone of the substrate support to allow the substrate 1102 to reach the targeted wafer temperature and etch amount 1111 (spatial profile).

Another model 1128 (which may be the inverse of the model shown in FIG. 8) uses the targeted heater temperature 1110 as an input and outputs targeted heat-exchanger temperature 1120, which is communicated to the heat-exchanger 1106.

Figure 12:
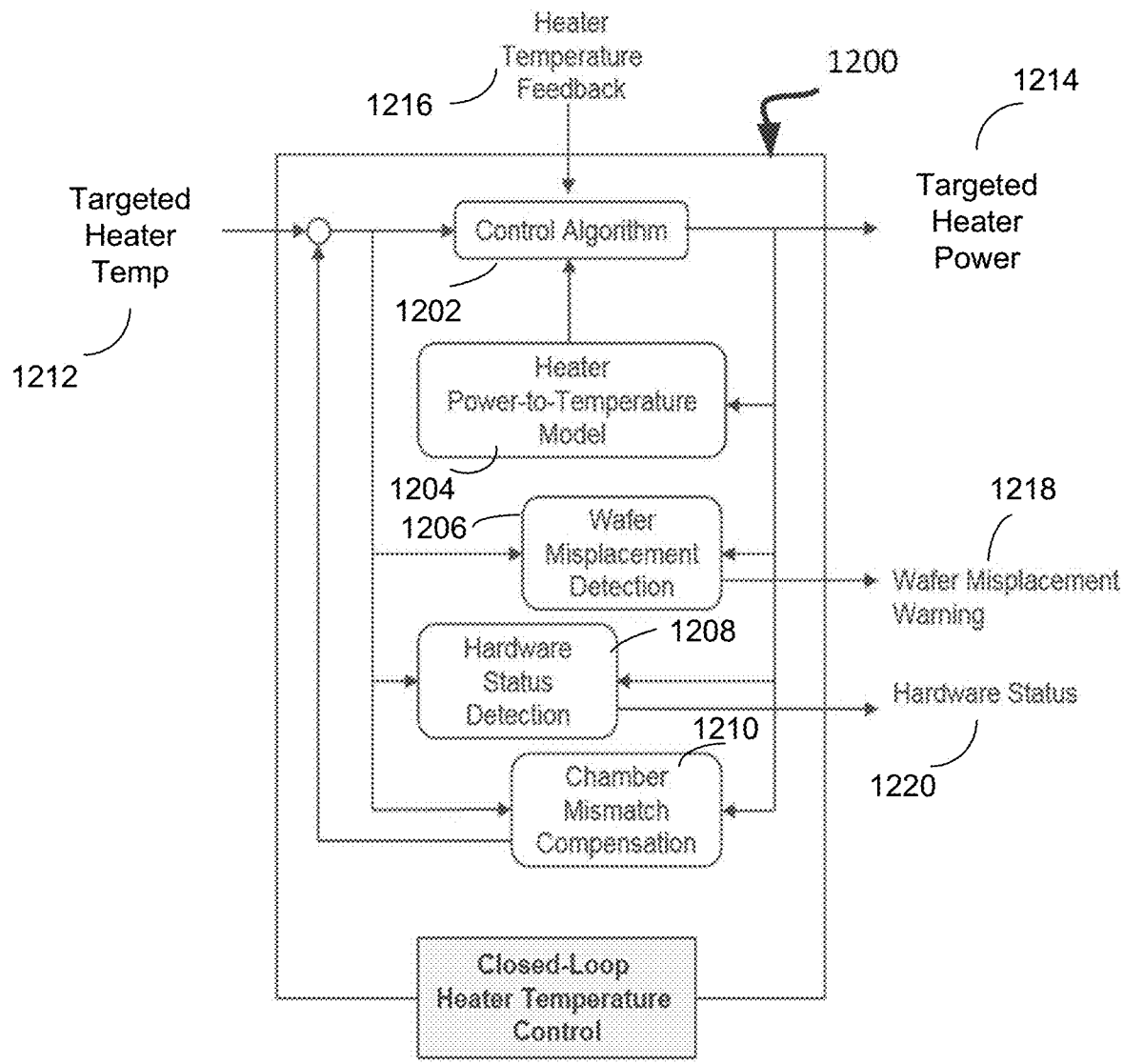
FIG. 12 illustrates how the closed loop heater temperature control serves different purposes, according to different embodiments of the present disclosure.

FIG. 12 shows how the closed-loop heater temperature control architecture 1200 (which is similar to 1114 described in FIG. 11) serves different purposes for the system shown in FIG. 10. At the core of the architecture 1200 is the control algorithm 1202, which receives heater temperature feedback 1216 from the RTDs. The inverse model shown in FIG. 11 calculates and provides the targeted heater temperature 1212 (similar to 1110 in FIG. 11) as an input to the closed-loop heater temperature control algorithm. The closed-loop heater temperature control algorithm uses the heater-power-to-temperature model 1204 to output targeted heater power 1214, which is supplied to the heater electronics, as shown in FIG. 11.

In addition, the algorithm may be used for wafer misplacement detection (1206) using power and temperature feedback information. Optionally, a wafer misplacement warning signal 1218 may be generated. Wafer misplacements can be detected using information about temperature and power usage around the edges of the substrate support. This capability is achieved by taking advantage of the zone layout depicted in FIG. 4: the availability of independent temperature measurements at the circular edge of the substrate support, allows to detect whether any of such zones get partially or fully exposed as a result of the substrate misplacement.

Further, the algorithm may facilitate detecting hardware status (1208), and optionally use graphic user interface (GUI) of the FES to display hardware status 1220.

Further yet, the algorithm may be utilized to determine mismatches among different installations on multiple chambers (1210), and compensate by adjusting targeted heater temperature. In particular, the compensator 1210 can be designed using information about a reference chamber, and corresponding acceptable variation limits. After the installation of new pedestal heaters on different chambers, the available information about temperature feedback measurements and power usage for all the zones of the substrate support can be compared in real-time or offline to the reference ones provided during the design stage. This allows to detect and warn about any hardware malfunction or mismatch beyond the predefined acceptable limits. Moreover, whenever permitted depending on the type of mismatch, quantitative information about the mismatches can be used to bias the targeted heater temperature 1110 to allow the substrate properties to meet the target specifications 1111.

Figure 13:
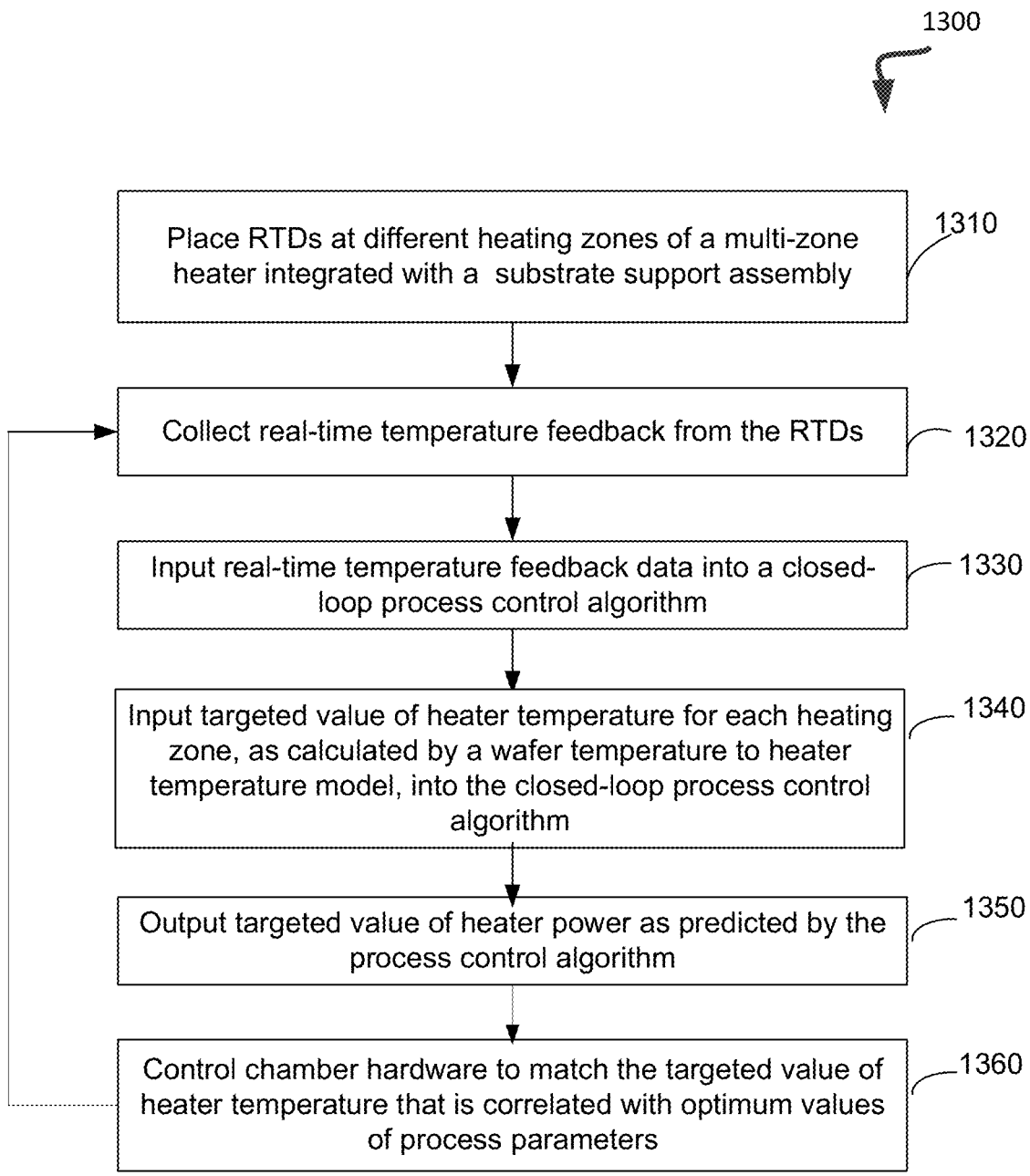
FIG. 13 is a flow diagram of one embodiment of a method for closed-loop temperature control.

FIG. 13 is a flow diagram of one embodiment of a method 1300 for closed-loop temperature control. The method 1300 may be performed by processing logic that may include hardware (e.g., processing device, circuitry, dedicated logic, programmable logic, microcode, hardware device, integrated circuit, etc.), software (e.g., instructions run or executed on a processing device), or a combination thereof. The method 1300 may be performed by components of the system of FIG. 10. To achieve the closed-loop control, operations in blocks 1320 to 1360 may be repeated.

Method 1300 starts with block 1310, by placing RTDs at different heating zones of a multi-zone heater integrated with a substrate support assembly, as described above.

At block 1320, temperature feedback is collected from the RTDs. The temperature feed-back may be collected real-time, i.e. without perceptible delay between measuring current temperature data and adjusting temperature by changing chamber hardware.

At block 1330, the real-time temperature feedback data is provided as an input to a closed-loop process control algorithm. Examples of process control algorithms have been discussed with reference to FIGS. 10-12.

At block 1340, targeted value of heater temperature for each heating zone is provided as another input to the closed-loop process control algorithm. The targeted value of heater temperature is calculated by a model, such as a wafer-temperature-to-heater temperature model. The wafer temperature is a function of process parameters, such as showerhead temperature, chamber pressure, distance of the heater from the showerhead etc., as shown in FIGS. 6, 7 and 10.

At block 1350, the algorithm outputs targeted value of heater power. Note that the algorithm may calculate power to be delivered to just one zone of the multi-zone heater, or may calculate corresponding values of power to be delivered to a plurality of zones of the multi-zone heater. Note that, in some embodiments multiple multi-zone heaters are employed. The algorithm has the ability to calculate power with the appropriate granularity commensurate with the spatial configuration of the multi-zone heater.

At block 1360, chamber hardware is controlled to match the targeted value of heater temperature that is correlated with optimum values of process parameters. The optimum values of prosed parameters may be the historical parameters corresponding to the best known method (BKM). For example, power of the heater may be controlled (an optionally, heat-exchanger temperature may be controlled) to achieve a certain temperature at a certain zone of the multi-zone heater so that the resulting wafer temperature indicates that the process parameters are optimum. Using the BKM values of the process parameters as reference, a current process may be tuned to come up with an improved recipe that is better suited for a particular chamber configuration to maximize yield.

Persons skilled in the art will understand that although the flow diagrams in FIG. 13 show a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

Figure 14:
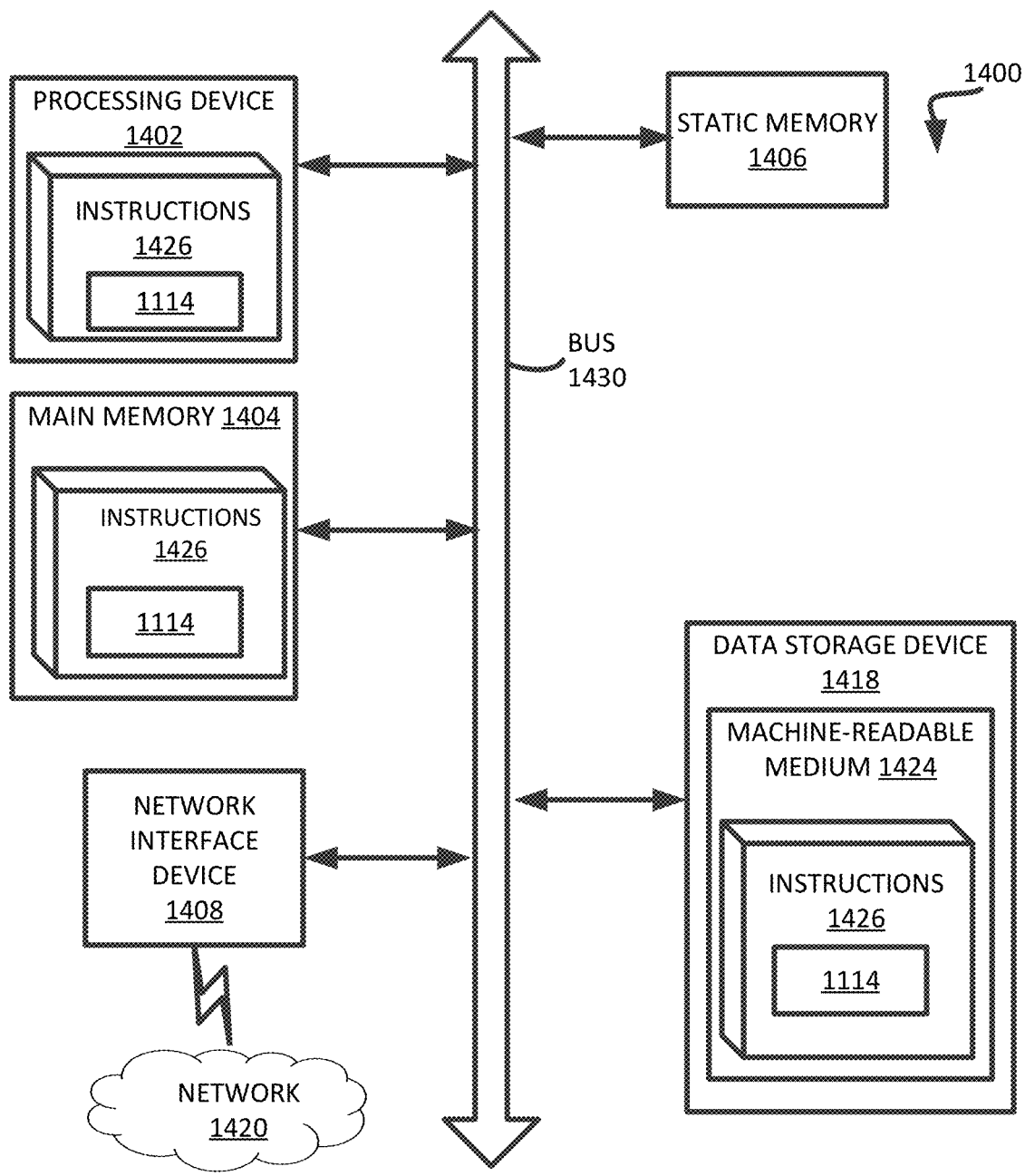
FIG. 14 illustrates a block diagram of a sample computer system in which some embodiments of the disclosure may operate.

FIG. 14 illustrates an example machine of a computer system 1400 within which a set of instructions, for causing the machine to perform any one or more of the methodologies discussed herein, can be executed. In some embodiments, the computer system 1400 can be used to perform the operations of a controller (e.g., to execute an algorithm to independently control temperature in a multi-zone heater). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 1400 includes a processing device 1402, a main memory 1404 (e.g., read-only memory (ROM), flash memory, dynamic random access memory (DRAM) such as synchronous DRAM (SDRAM) etc.), a static memory 1406 (e.g., flash memory, static random access memory (SRAM), etc.), and a data storage system 1418, which communicate with each other via a bus 1430.

Processing device 1402 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 1402 can also be one or more special-purpose processing devices such as an application specific integrated circuit (ASIC), a field programmable gate array (FPGA), a digital signal processor (DSP), network processor, or the like. The processing device 1402 is configured to execute instructions 1426 for performing the operations and steps discussed herein. The computer system 1400 can further include a network interface device 1408 to communicate over the network 1420.

The data storage device 1418 can include a machine-readable medium 1424 (also known as a computer-readable medium) on which is stored one or more sets of instructions 1426 or software embodying any one or more of the methodologies or functions described herein (e.g., instructions for closed-loop process control algorithm 1114). The instructions 1426 can also reside, completely or at least partially, within the main memory 1404 and/or within the processing device 1402 during execution thereof by the computer system 1400, the main memory 1404 and the processing device 1402 also constituting machine-readable storage media.

In one embodiment, the instructions 1426 include instructions to run an algorithm to control the process parameters. While the machine-readable storage medium 1424 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A method comprising operations of:
collecting temperature feedback from a plurality of temperature detectors, each of the plurality of temperature detectors being placed in a corresponding heating zone of a plurality of heating zones of a substrate support assembly supporting a wafer;
providing data representing the temperature feedback as a first input to a process control algorithm that is part of a model-based control architecture;
providing, as a second input to the process control algorithm, targeted values of heater temperature for one or more heating zones of the plurality of heating zones, as calculated using an inverse model configured to calculate a targeted value of heater temperature for a particular heating zone of one or more of the heating zones based on wafer etch amount and wafer temperature corresponding to current optimum values of one or more process parameters, wherein the model-based control architecture also comprises an inverse heat-exchanger sub-model that correlates the targeted values of the heater temperature with flow of coolant supplied by the heat-exchanger;
calculating targeted values of heater power for achieving the targeted values of heater temperature for one or more of the heating zones, wherein the calculation is performed, by a processor running the process control algorithm, based on the first input and the second input; and
controlling, by the model-based control architecture, chamber hardware of a processing chamber comprising the substrate support assembly to match the targeted values of heater temperature for one or more of the heating zones while fabricating the wafer in the process chamber.

2. The method of claim 1, wherein the plurality of temperature detectors comprises a plurality of resistance temperature detectors (RTDs).

3. The method of claim 1, wherein process parameters used by the inverse model include one or more of: temperature of a showerhead, chamber pressure, or, distance between the showerhead and the substrate support assembly.

4. The method of claim 3, wherein the inverse model takes into account wafer characteristics including wafer material and layer being etched.

5. The method of claim 3, wherein process parameters used by the inverse model further include one or more of: chamber body temperature, heat-exchanger temperature, lift-pin height, or, process gas.

6. The method of claim 1, wherein the process control algorithm is a closed-loop algorithm where the operations of collecting the temperature feedback, providing data representing the temperature feedback, providing targeted values of the heater temperature, calculating targeted values of the heater power, and controlling chamber hardware are repeated.

7. The method of claim 1, wherein the operation of controlling the chamber hardware comprises:
controlling heater electronics to deliver the calculated targeted values of heater power to one or more of the heating zones.

8. The method of claim 7, wherein the operation of controlling the chamber hardware further comprises:
controlling heat-exchanger temperature to achieve targeted values of heater temperature for one or more of the heating zones.

9. The method of claim 1, wherein the inverse model is trained with historical chamber data using a machine-learning algorithm.

10. The method of claim 1, wherein each of the plurality of heating zones comprises one or more heaters.

11. The method of claim 1, wherein the substrate support assembly has a plurality of regions, each region having a corresponding independently-controllable plurality of heating zones.

12. A system comprising:
a plurality of temperature detectors, each of the plurality of temperature detectors being placed in a corresponding heating zone of a plurality of heating zones of a substrate support assembly configured to support a wafer;
a processor that is to execute a process control algorithm that is part of a model-based control architecture, the processor to:
receive temperature feedback data from the plurality of temperature detectors;
provide the temperature feedback data as a first input to the process control algorithm;
calculate, using an inverse model stored in a server, targeted values of heater temperature for one or more of the heating zones of the plurality of heating zones, wherein the inverse model is configured to calculate a targeted value of heater temperature for a particular heating zone of one or more of the heating zones based on wafer etch amount and wafer temperature corresponding to current optimum values of one or more process parameters;
provide, as a second input to the process control algorithm, the targeted values of heater temperature for the one or more heating zones, as calculated by the inverse model, wherein the model-based control architecture also comprises an inverse heat-exchanger sub-model that correlates the targeted values of the heater temperature with flow of coolant supplied by the heat-exchanger;
calculate targeted values of heater power for achieving the targeted values of heater temperature for the one or more heating zones, based on the first input and the second input; and
calculate, by the model-based control architecture, amounts by which chamber hardware of a processing chamber comprising the substrate support assembly is to be adjusted to match the targeted values of heater temperature for one or more of the heating zones while fabricating the wafer in the processing chamber.

13. The system of claim 12, wherein the plurality of temperature detectors comprises a plurality of resistance temperature detectors (RTDs).

14. The system of claim 12, wherein process parameters used by the inverse model includes one or more of: temperature of a showerhead, chamber pressure, or, distance between the showerhead and the substrate support assembly.

15. The system of claim 14, wherein process parameters used by the inverse model further includes one or more of: chamber body temperature, heat-exchanger temperature, lift-pin height, or, process gas.

16. The system of claim 12, wherein the chamber hardware comprises:
heater electronics that delivers the calculated targeted values of heater power to the one or more heating zones.

17. The system of claim 16, wherein the chamber hardware further comprises:
heat-exchanger temperature controller that helps in achieving targeted values of heater temperature for the one or more heating zones.

18. The system of claim 12, wherein the process control algorithm is a closed-loop algorithm.

* * * * *